United States Patent
Gardner et al.

(10) Patent No.: US 6,483,157 B1
(45) Date of Patent: Nov. 19, 2002

(54) ASYMMETRICAL TRANSISTOR HAVING A BARRIER-INCORPORATED GATE OXIDE AND A GRADED IMPLANT ONLY IN THE DRAIN-SIDE JUNCTION AREA

(75) Inventors: Mark I. Gardner, Cedar Creek, TX (US); H. Jim Fulford, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 674 days.

(21) Appl. No.: 08/879,620

(22) Filed: Jun. 20, 1997

(51) Int. Cl.⁷ .......................... H01L 29/76; H01L 29/94; H01L 31/062; H01L 31/113; H01L 31/119; H01L 27/088

(52) U.S. Cl. ........................................ 257/408; 257/900

(58) Field of Search ................................. 257/344, 408, 257/900, 411; 438/762, 298, 303, 304, 305

(56) References Cited

U.S. PATENT DOCUMENTS

| | | |
|---|---|---|
| 4,120,700 A | 10/1978 | Morimoto |
| 4,559,096 A | 12/1985 | Friedman et al. |
| 4,929,489 A | 5/1990 | Dreschhoff et al. |
| 5,070,046 A | 12/1991 | Hu |

(List continued on next page.)

FOREIGN PATENT DOCUMENTS

| | | | | |
|---|---|---|---|---|
| EP | 250 3 | * | 11/1991 | ................. 257/344 |
| JP | 359228764 A | * | 12/1984 | ................. 257/408 |

OTHER PUBLICATIONS

Yamada et al. "Gas Cluster Ion Beam Processing for ULSI Fabrication," Reprinted from Materials Research Society Symposium Proceedings vol. 427, *Advanced Metallization for Future ULSI*.

Raaijamakers "Low Temperature Metal—Organic Chemical Vapor Deposition of Advanced Barrier Layers for the Microelectronics Industry," *Thin Solid Films*, 247 (1994) pp. 85–93.

*Primary Examiner*—Cuong Quang Nguyen
(74) *Attorney, Agent, or Firm*—Kevin L. Daffer; Conley, Rose & Tayon, P.C.

(57) ABSTRACT

A transistor fabrication process is provided which derives a benefit from having an asymmetrical LDD structure. A silicon-based substrate is provided. A gate oxide layer is grown across the substrate. The gate oxide layer may be incorporated with barrier atoms bonded to silicon or oxygen atoms. Suitable barrier atoms include nitrogen atoms which help reduce hot electron effects by blocking diffusion avenues of carriers (i.e., holes or electrons) from the drain-side junction, through the channel near the drain and into the gate oxide of the ensuing transistor. A polysilicon layer is then deposited across the gate oxide layer. Portions of the polysilicon layer and the oxide layer are then removed to form a gate conductor and gate oxide and to expose source-side and drain-side junctions within the substrate. A first dopant is implanted exclusively into only the source-side junction region. A second implant is then forwarded at a lower concentration into both junctions. An oxide spacer is formed on the sidewall surface of the gate conductor nearest the drain region. A third dopant is then forwarded into the gate conductor and source and drain regions at a higher concentration than the previous implants. Thus, source and drain junctions are formed within the substrate that are spaced apart by the gate conductor and the oxide spacer. Since the drain junction overlaps a portion of the LDD area, the remaining portion of the LDD area is defined exclusively between the channel of the transistor and the drain junction.

8 Claims, 3 Drawing Sheets

U.S. PATENT DOCUMENTS

| | | |
|---|---|---|
| 5,111,355 A | 5/1992 | Anand et al. |
| 5,142,438 A | 8/1992 | Reinberg et al. |
| 5,186,718 A | 2/1993 | Tepman et al. |
| 5,246,884 A | 9/1993 | Jaso et al. |
| 5,258,333 A * | 11/1993 | Shappir et al. .............. 438/762 |
| 5,281,554 A | 1/1994 | Shimada et al. |
| 5,304,503 A | 4/1994 | Yoon et al. |
| 5,426,327 A * | 6/1995 | Murai ........................ 257/408 |
| 5,428,240 A * | 6/1995 | Lur ............................ 257/408 |
| 5,538,914 A * | 7/1996 | Chu et al. ................... 438/305 |
| 5,552,337 A | 9/1996 | Kwon et al. |
| 5,593,907 A * | 1/1997 | Anjum et al. ................ 438/298 |
| 5,627,087 A * | 5/1997 | Hsu ........................... 438/305 |
| 5,648,287 A * | 7/1997 | Gardner et al. ............. 438/305 |
| 5,677,015 A | 10/1997 | Hasegawa |
| 5,763,922 A * | 6/1998 | Chau .......................... 257/411 |

\* cited by examiner

ASYMMETRICAL TRANSISTOR HAVING A BARRIER-INCORPORATED GATE OXIDE AND A GRADED IMPLANT ONLY IN THE DRAIN-SIDE JUNCTION AREA

BACKGROUND OF THE INVENTION

1. Field of the Invention

This invention relates to the manufacture of an integrated circuit and, more particularly, to the formation of an n-channel and/or p-channel asymmetrical transistor having a gate oxide incorporated with barrier atoms to enhance transistor performance.

2. Description of the Related Art

Fabrication of a MOSFET device is well known. Generally speaking, MOSFETs are manufactured by placing an undoped polycrystalline ("polysilicon") material over a relatively thin gate oxide. The polysilicon material and gate oxide is then patterned to form a gate conductor formed laterally between exposed regions of single crystalline silicon substrate. The gate conductor and exposed substrate regions are then implanted with an impurity dopant material. If the impurity dopant material used for forming the junction areas within the exposed substrate is n-type, then the resulting MOSFET is an NMOSFET ("n-channel") transistor device. Conversely, if the dopant material is p-type, then the resulting MOSFET is a PMOSFET ("p-channel") transistor device.

The gate conductor and adjacent implant areas (herein "junctions") are formed using well known photolithography and ion implant techniques. Gate conductors and implant regions arise in openings formed through a thick dielectric layer of what is commonly referred to as field oxide. Those openings and the transistors formed therein are termed active regions. The active regions are therefore regions between field oxide regions. Metal interconnect is routed over the field oxide to couple with the polysilicon gate conductor as well as with the junction to complete the formation of an integrated circuit.

Integrated circuits utilize either n-channel devices exclusively, p-channel devices exclusively, or a combination of both on a single monolithic substrate. While both types of devices can be formed, the devices are distinguishable based on the dopant species used. The method by which n-type dopant is used to form an n-channel device and p-type dopant is used to form a p-channel device entails unique problems associated with each device. As layout densities increase, the problems are exacerbated. Device failure can occur unless adjustments are made to processing parameters and processing steps. N-channel processing must, in most instances, be dissimilar from p-channel processing due to the unique problems of n-channel transistors relative to each type of device.

N-channel devices are particularly sensitive to so-called short-channel effects ("SCE"). The distance between a source-side junction and a drain-side junction is often referred to as the physical channel length. However, after implantation and subsequent diffusion of the junctions, the actual distance between junctions becomes less than the physical channel length and is often referred to as the effective channel length ("Leff"). In VLSI designs, as the physical channel becomes small, so too must the Leff. SCE becomes a predominant problem whenever Leff drops below, e.g., 2.0 $\mu$m.

Generally speaking, SCE impacts device operation by, inter alia, reducing device threshold voltages and increasing sub-threshold currents. As Leff becomes quite small, the depletion regions associated with the source and drain areas within the junctions may extend toward one another and substantially occupy the channel area. Hence, some of the channel will be partially depleted without any influence of gate voltage. As a result, less gate charge is required to invert the channel of a transistor having a short Leff. Somewhat related to threshold voltage lowering is the concept of sub-threshold current flow. Even at times when the gate voltage is below the threshold amount, current between the source and drain nonetheless exist for transistors having a relatively short Leff.

Two of the primary causes of increased sub-threshold current are: (i) punch through and (ii) drain-induced barrier lowering ("DIBL"). Punch through results from the widening of the drain depletion region when a reverse-bias voltage is applied across the drain-well diode. The electric field of the drain may eventually penetrate to the source area, thereby reducing the potential energy barrier of the source-to-body junction. Punch through current is therefore associated within the substrate bulk material, well below the substrate surface. Contrary to punch through current, DIBL-induced current occurs mostly at the substrate surface. Application of a drain voltage can cause the surface potential to be lowered, resulting in a lowered potential energy barrier at the surface and causing the sub-threshold current in the channel near the silicon-silicon dioxide interface to be increased. One method in which to control SCE is to increase the dopant concentration within the body of the device. Unfortunately, increasing dopant within the body deleteriously increases potential gradients in the ensuing device.

Increasing the potential gradients produces an additional problems known as hot-carrier effect/injection ("HCI"). HCI is a phenomena by which the kinetic energy of the carriers (holes or electrons) is increased as they are accelerated through large potential gradients and subsequently become trapped within the gate oxide. The greatest potential gradient, often referred to as the maximum electric field ("Em") occurs near the drain during saturated operation. More specifically, the electric field is predominant at the lateral junction of the drain adjacent the channel.

Using the n-channel example, the electric field at the drain causes channel electrons to gain kinetic energy. Electron-electron scattering randomizes the kinetic energy and the electrons become "hot". Some of these hot electrons have enough energy to create electron-hole pairs through impact ionization of the silicon atoms. Electrons generated by impact ionization join the flow of channel electrons, while the holes flow into the bulk to produce a substrate current in the device. The substrate current is the first indication of the creation of hot carriers in a device. For p-channel devices, the fundamentals of the process are essentially the same except that the role of holes and electrons are reversed.

HCI occurs when some of the hot carriers are injected into the gate oxide near the drain-side junction, where they induce damage and become trapped. Traps within the gate oxide generally become electron traps, even if they are initially filled with holes. As a result, there is a negative charge density in the gate oxide. The trapped charge accumulates with time, resulting in positive threshold shifts in both n-channel and p-channel devices. It is known that since hot electrons are more mobile than hot holes, HCI causes a greater threshold skew in n-channel devices than p-channel devices. Nonetheless, a p-channel device will undergo negative threshold skew if its Leff is less than, e.g., 0.8 $\mu$m.

Unless modifications are made to the transistor structure, problems of sub-threshold current and threshold shift resulting from SCE and HCI will remain. To overcome these problems, alternative drain structures such as double-diffused drains (DDDs) and lightly doped drains (LDDs) must be used. The purpose of both types of structures is the same: to absorb some of the potential into the drain and thus reduce Em. The popularity of DDD structures has given way to LDD structures since DDD causes unacceptably deep junctions and deleterious junction capacitance.

A conventional LDD structure is one whereby a light concentration of dopant is self-aligned to the gate conductor followed by a heavier dopant self-aligned to the gate conductor on which two sidewall spacers have been formed. The purpose of the first implant dose is to produce a lightly doped section within the junction at the gate edge near the channel. The second implant dose is spaced from the channel a distance dictated by the thickness of the sidewall spacer. The second implant dose is the source/drain implant placed within the junction laterally outside the LDD area, also within the junction. Resulting from the first and second implants, a dopant gradient (i.e., "graded junction") occurs at the interface between the source and channel as well as between the drain and channel.

A properly defined LDD structure must be one which minimizes HCI but not at the expense of excessive source/drain resistance. The addition of an LDD implant adjacent the channel unfortunately adds capacitance and resistance to the source/drain path. This added resistance, generally known as parasitic resistance, can have many deleterious effects. First, parasitic resistance can decrease the saturation current (i.e., current above threshold). Second, parasitic capacitance can decrease the overall speed of the transistor.

The deleterious effects of decreased saturation current and transistor speed is best explained in reference to a transistor having a source and drain parasitic resistance. This resistance is compounded by the presence of the conventional source and drain LDDs. Using a n-channel example, the drain resistance $R_D$ causes the gate edge near the drain to "see" a voltage, e.g., less than VDD, to which the drain is typically connected. Similarly, the source resistance $R_S$ causes the gate edge near the source to see some voltage, e.g., more than ground. As far as the transistor is concerned, its drive current along the source-drain path depends mostly on the voltage applied between the gate and source, i.e., $V_{GS}$. If $V_{GS}$ exceeds the threshold amount, the transistor will go into saturation according to the following relation:

$$I_{DSAT} = K/2 \cdot (V_{GS} - V_T)^2$$

,where $I_{DSAT}$ is saturation current, K is a value derived as a function of the process parameters used in producing the transistor, and $V_T$ is the threshold voltage. Reducing or eliminating $R_S$ would therefore draw the source-coupled voltage closer to ground, and thereby increase the effective $V_{GS}$. From the above equation, it can be seen that increasing $V_{GS}$ directly increases $I_{DSAT}$. While it would seem beneficial to decrease $R_D$ as well, $R_D$ is nonetheless needed to maintain HCI control. Accordingly, a substantial LDD area is required in the drain area.

Proper LDD design must take into account the need for minimizing parasitic resistance $R_S$ at the source side while at the same time attenuating Em at the drain side of the channel. Further, proper LDD design requires that the injection position associated with the maximum electric field Em be located under the gate conductor edge, preferably well below the silicon surface. It is therefore desirable to derive an LDD design which can achieve the aforesaid benefits while still properly placing and diffusing Em. This mandates that the channel-side lateral edge of the LDD area be well below the edge of the gate. Regardless of the LDD structure chosen, the ensuing transistor must be one which is not prone to excessive sub-threshold currents, even when the Leff is less than, e.g., 2.0 μm.

A properly designed LDD-embodied transistor which overcomes the above problems must therefore be applicable to either an n-channel transistor or a p-channel transistor. That transistor must be one which is readily fabricated within existing process technologies. In accordance with many modem fabrication techniques, it would be desirable that the improved transistor be formed having a net impurity concentration within the polysilicon gate of the same type as the junction regions (i.e., LDD implant and/or source/drain regions).

SUMMARY OF THE INVENTION

The problems outlined above are in large part solved by an improved transistor configuration. The transistor can be either a p-channel or n-channel transistor. The transistor hereof is classified as an asymmetrical transistor in that the LDD implant is purposefully formed exclusively in the drain-side junction between the channel and the drain region. Thus, LDD area is eliminated from the source-side of the transistor.

A net LDD focused primarily at the drain side maintains parasitic resistance of the drain LDD (i.e., $R_D$) but reduces if not eliminates LDD-induced parasitic resistance $R_S$ associated with the source-side LDD implant. Thus, the drain-engineered structure hereof serves to attenuate the maximum electric field Em in the critical drain area while reducing parasitic resistance $R_S$ in the source area. The drain-side LDD region is bounded by a junction which exists below the gate edge and below the silicon surface. The LDD area, however, is attributed solely or primarily to the critical area near the drain. Shifting the electric field, Em, occurs only in the region where shifting is necessary, i.e., only in the drain-side of the channel.

The p- or n-channel transistor formed as a result of the present LDD design receives the benefit of reduced HCI but not at the expense of performance (i.e., switching speed or saturation current). Even when Leff is less than 2.0 μm, where SCE would normally be a problem, the present transistor experiences minimal sub-threshold currents. The present transistor advantageously employs a net p- or n-type dopant in the polysilicon gate which matches the dopant within the source and drain areas. By utilizing similar dopant within polysilicon as that used in the drain-side LDD and the source/drain region, the present process can be more readily incorporated into existing process flows.

Equally important in the present process is a step used to further reduce HCI. The gate oxide may have barrier atoms incorporated therein by thermally growing the gate oxide in a barrier-containing ambient, a suitable ambient being one that contains nitrogen and oxygen. The result of such a step is a gate oxide containing barrier atoms such as nitrogen. The improvement in hot-carrier reliability is mainly attributed to the presence of nitrogen at the interface between the silicon substrate and the gate oxide (i.e., the $Si/SiO_2$ interface). The presence of nitrogen at the $Si/SiO_2$ interface helps prevent high-energy carriers (electrons or holes) from migrating into the gate oxide since the nitrogen atoms occupy a substantial portion of the migration avenues at the substrate/oxide interface. Further, charge carrier trapping of any electrons that do pass into the gate oxide is limited since strong Si—N bonds exist in place of weaker Si—H and strained Si—O bonds. It is preferred the barrier atoms be nitrogen atoms, however, it is not necessary the barrier atoms be limited exclusively to nitrogen. It is further preferred the barrier atoms exist at the substrate-oxide interface between the drain-side junction and the overlying gate conductor. Barrier atoms thusly placed minimize hot carrier injection into the gate conductor predominantly from the drain-side junction.

In an embodiment of the present invention, a nitrided gate oxide layer is thermally grown across a silicon-based substrate. In order to form such a nitrided oxide layer, the substrate is exposed to a nitrogen and oxygen containing ambient. A layer of polysilicon is then deposited across the oxide layer. Portions of the oxide layer and the polysilicon layer may be removed to form a patterned gate conductor. A lithography step is performed to present a patterned masking layer, i.e., photoresist, across a portion of the gate conductor and the active area on one side of the gate conductor (henceforth referred to as the drain-side junction). Subsequently, the exposed active area opposite the gate conductor side on which the photoresist is patterned (i.e., the source-side junction) may be implanted with either a p-type or n-type dopant, depending on the desired transistor type being formed.

The junctions on opposite sides of the gate conductor may then be implanted using the same type dopant but at a concentration less than the previous implant exclusively in the source region. This implant is therefore a second implant, and is more specifically referred to as LDD implant. The LDD implant, while implanted into both the source and drain regions, net an LDD area only in the drain region since the first implant source regions, being heavily doped, is unaffected by the smaller dopant concentrations of the second implant. Oxide spacers are then formed upon opposed sidewall surfaces of the gate conductor. The spacers are preferably arranged above portions of the heavily doped source-side junction and LDD drain-side junction. The exposed portions of the source-and drain-side junctions are then heavily doped with the same type of dopant previously used. These heavily doped regions result in source and drain areas within the junctions that are aligned to the exposed lateral edges of the oxide spacers.

BRIEF DESCRIPTION OF THE DRAWINGS

Other objects and advantages of the invention will become apparent upon reading the following detailed description and upon reference to the accompanying drawings in which.

Figure 1:
FIG. 1 is a cross-sectional view of semiconductor topography, wherein a barrier-entrained oxide layer is grown across a silicon substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning to FIG. 1, a nitrided oxide layer 12 is formed across a single crystalline silicon substrate 10. In one instance, nitrided oxide layer 12 may be formed by subjecting the silicon substrate to a gas having barrier containing compounds. According to one example, the barrier material comprises nitrogen and oxygen containing compounds (e.g. $N_2O$ or NO), thereby promoting the growth of barrier-entrained oxide (or nitrided) layer 12. Layer 12 is primarily composed of silicon dioxide resulting from silicon atoms at the surface of substrate 10 bonding with the ambient oxygen atoms. A nitrided oxide layer is primarily composed of silicon nitride since silicon atoms also readily bond with nitrogen atoms, resulting in a highly stable bond. The atomic nitrogen also forms bonds with oxygen atoms. Thus, Si—N and N—O bonds are located at relatively uniform intervals throughout oxide layer 12.

Figure 2:
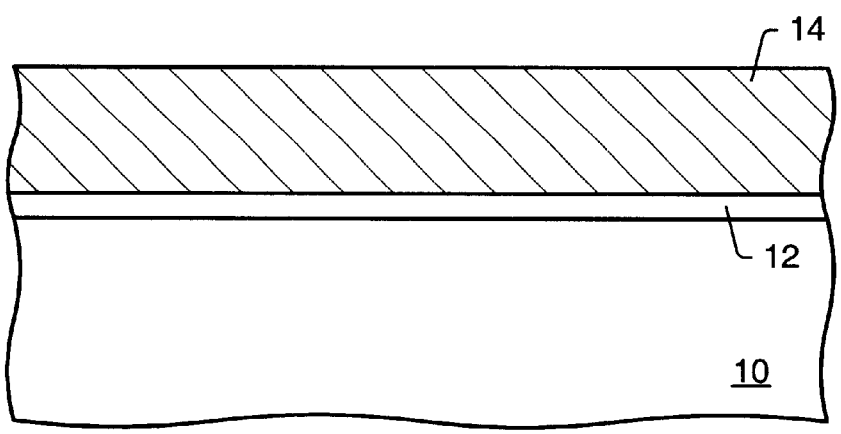
FIG. 2 is a cross-sectional view of the semiconductor topography, wherein a polysilicon layer is deposited across the oxide layer, subsequent to the step in FIG. 1.
Figure 3:
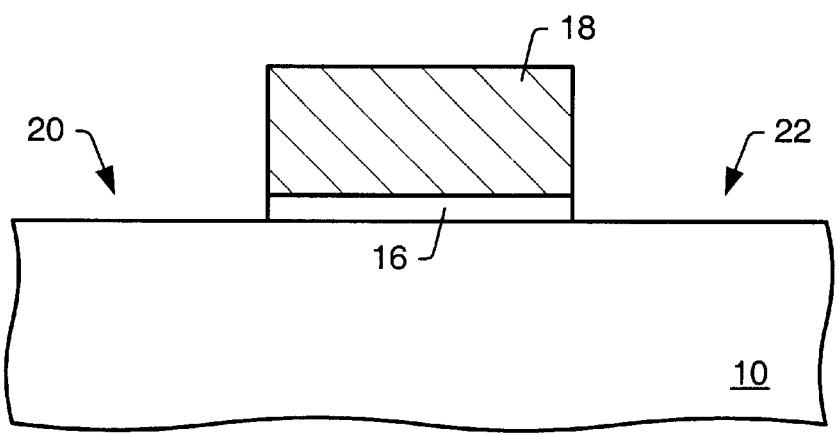
FIG. 3 is a cross-sectional view of the semiconductor topography, wherein portions of the oxide layer and the polysilicon layer are removed to form a gate oxide and a gate conductor interposed between a pair of junction areas embodied within the silicon substrate, subsequent to the step in FIG. 2.

FIG. 2 depicts the formation of a polysilicon layer 14 across nitrided oxide layer 12. Polysilicon layer 14 is preferably formed using chemical vapor deposition ("CVD"). FIG. 3 illustrates the formation of a gate conductor 18, a gate oxide 16, and exposed regions 20 and 22 of substrate 10. Portions of polysilicon layer 14 and oxide layer 12 may be etched to the underlying silicon substrate 10 using a dry, plasma etch. Etch duration is selected to terminate a pre-determined distance below the surface of polysilicon layer 14 before substantial surface portions of the substrate can be etched away. The etchant can also be chosen highly selective to silicon so as not to remove silicon at a rate anywhere near the rate at which polysilicon and/or oxide is removed. Exposed regions 20 and 22 are confined within active areas between gate conductor 18 and a field oxide (not shown). Exposed regions 20 and 22 are interchangeably referred to as junction regions, in that junctions will eventually be formed in regions 20 and 22.

The resulting gate conductor 18 has relatively vertical opposed sidewall surfaces. Gate oxide 16 is interposed between substrate 10 and gate conductor 18. Regions 20 and 22 are spaced apart by gate oxide 16 and are henceforth referred to as junction regions, although junctions are not formed until ions are forwarded therein.

Figure 4:
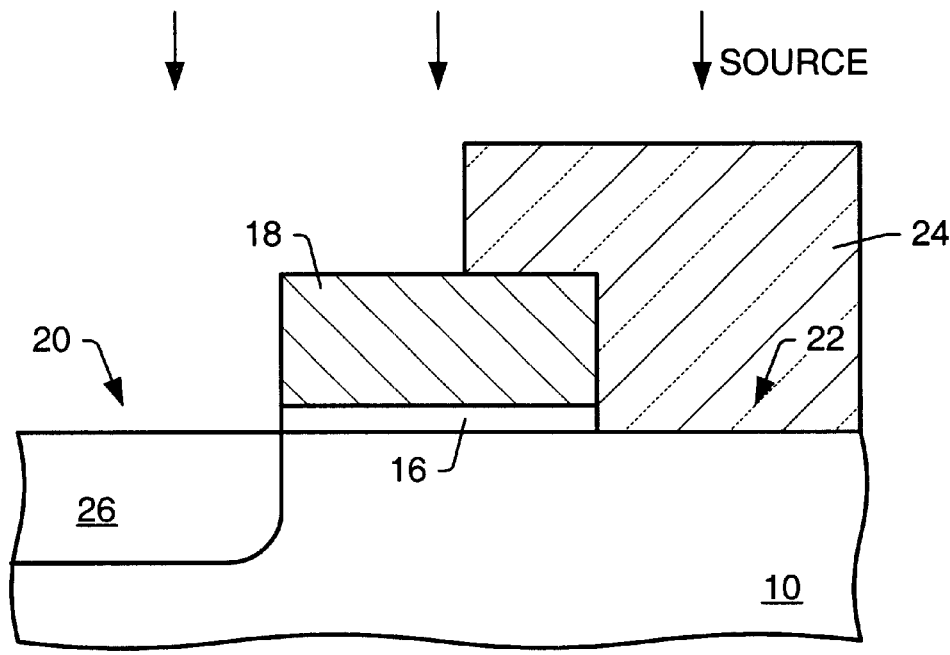
FIG. 4 is a cross-sectional view of the semiconductor topography, wherein a first dopant is implanted exclusively into the source-side junction, subsequent to the step in FIG. 3.

Turning to FIG. 4, a photoresist masking layer 24 is patterned across drain region 22 and a portion of gate conductor 18 using optical lithography. Advantageously, no exact alignment of masking layer 24 is required since it is only necessary to cover drain region 22 while exposing source region 20. Whether or not gate conductor 18 is exposed is of no importance to the present technique. Thus, masking layer 24, when patterned, can be misaligned anywhere upon the gate conductor surface and/or upon the field oxide surface.

Once masking layer 24 is patterned, a first dopant implant may be forwarded into source region 20 to form a source-side junction 26 within an upper portion of substrate 10. Masking layer 24 substantially prevents dopants from entering into drain-side junction area 22. The dopants implanted into source region 20 may be n-type dopants or p-type dopants, depending on the desired type of transistor. Some commonly used p-type dopants are boron or boron difluoride, and some commonly used n-type dopants are arsenic or phosphorus. The photoresist masking layer 24 may then be removed (i.e., stripped) using techniques well known in the art.

Figure 5:
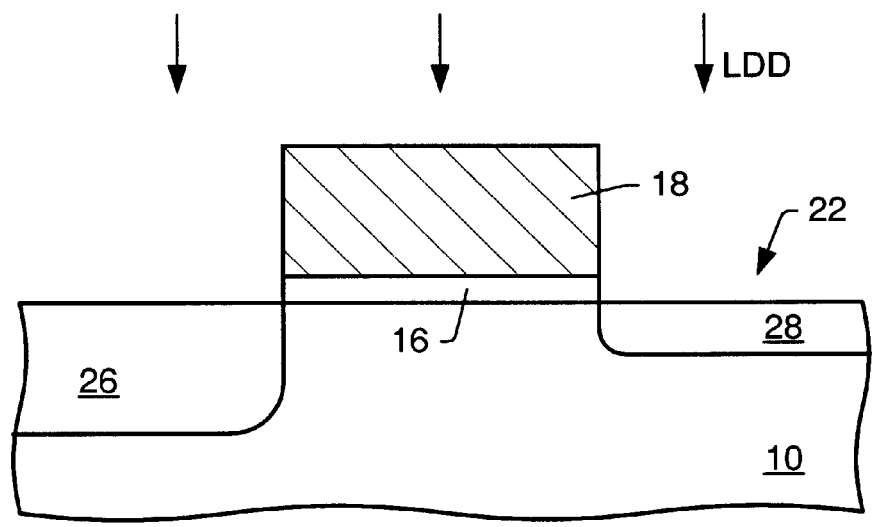
FIG. 5 is a cross-sectional view of the semiconductor topography, wherein a second dopant is implanted into the pair of junctions to form an LDD area exclusively within the drain region, subsequent to the step in FIG. 4.

As depicted in FIG. 5, a second dopant implant, i.e., an LDD implant, may then be forwarded into the previously implanted junction 26 and the non-implanted junction area 28. The dopant used for the LDD implant is preferably of the same type and at a lower concentration than that used for the first dopant implant. Since the LDD implant overlaps source junction 26, the electrical characteristics of the previous source implant is not affected by this second implant therein. The LDD merely adds to the pre-existing heavy concentration within junction 26 to maintain a net low resistivity junction area on which a contact can be reliably made. However, LDD area 28 results in, and is located within, an upper portion of drain region 22. More specifically, LDD area 28 occurs near the surface of junction area 22. As will be discussed infra, LDD area 28 will eventually be retained only in a region of the junction area 22 adjacent an area called the channel area, said channel area is configured directly below gate conductor 18.

Figure 6:
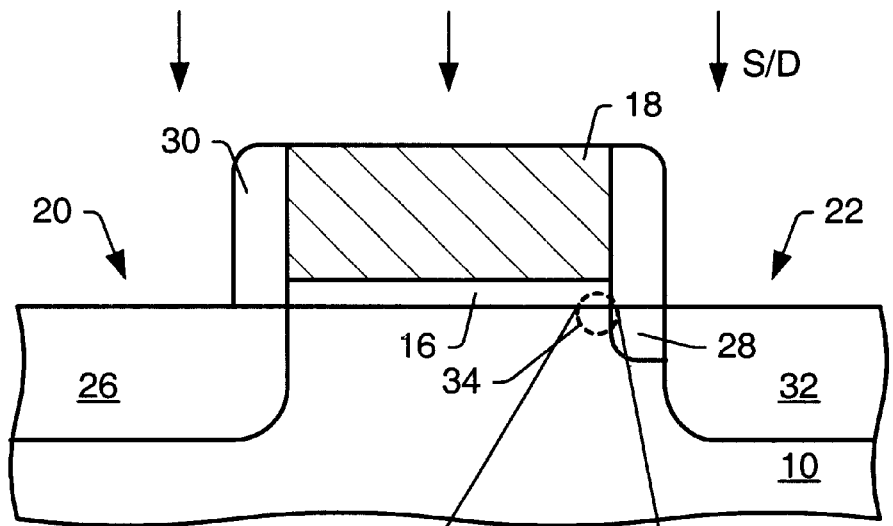
FIG. 6 is a cross-sectional view of the semiconductor topography, wherein a pair of oxide spacers are formed upon sidewall surfaces of the gate conductor and a third dopant is implanted into exposed portions of the pair of junctions to form source and drain regions, subsequent to the step in FIG. 5.

FIG. 6 depicts the formation of oxide spacers 30 upon the sidewall surfaces of the gate conductor and above portions of source-side junction 26 and LDD area 28. These oxide spacers may be formed by the deposition of oxide across exposed regions of substrate 10 and gate conductor 18, followed by anisotropic removal of the oxide with the exception of horizontal surfaces that the anisotropically directed etchant ions cannot readily access. A heavily doping source/drain ("S/D") implant may then be forwarded to source and drain regions 20 and 22 and to gate conductor 18. The S/D implant is self-aligned to lateral surfaces of oxide spacers 30. Thus, a drain junction 32 extends a spaced distance from the channel edge, outside a portion of LDD region 28, thereby dominating the LDD/drain overlap area to form a drain region 32. The remaining LDD region 28 is bound exclusively between the channel (below gate conductor 18) and drain junction 32. The resulting doped junctions 26 and 32 and gate conductor 18 contain a majority charge carrier opposite that of the surrounding bulk silicon substrate 10. The dopants are preferably forwarded by ion implantation at an energy and concentration to form reliable source and drain areas onto which a contact structure can be operably connected. The concentration is chosen to effectuate whatever threshold voltage, junction resistance/capacitance is needed to operate, within the design specification, the ensuing transistor.

The S/D implant completes the formation of a transistor having a LDD region exclusively between the channel and the drain portion of the drain-side junction. Such a transistor serves to promote the presence of the maximum electric field Em in the critical drain area while reducing parasitic resistance $R_S$ in the source area, resulting in a reduction of HCI.

Figure 7:
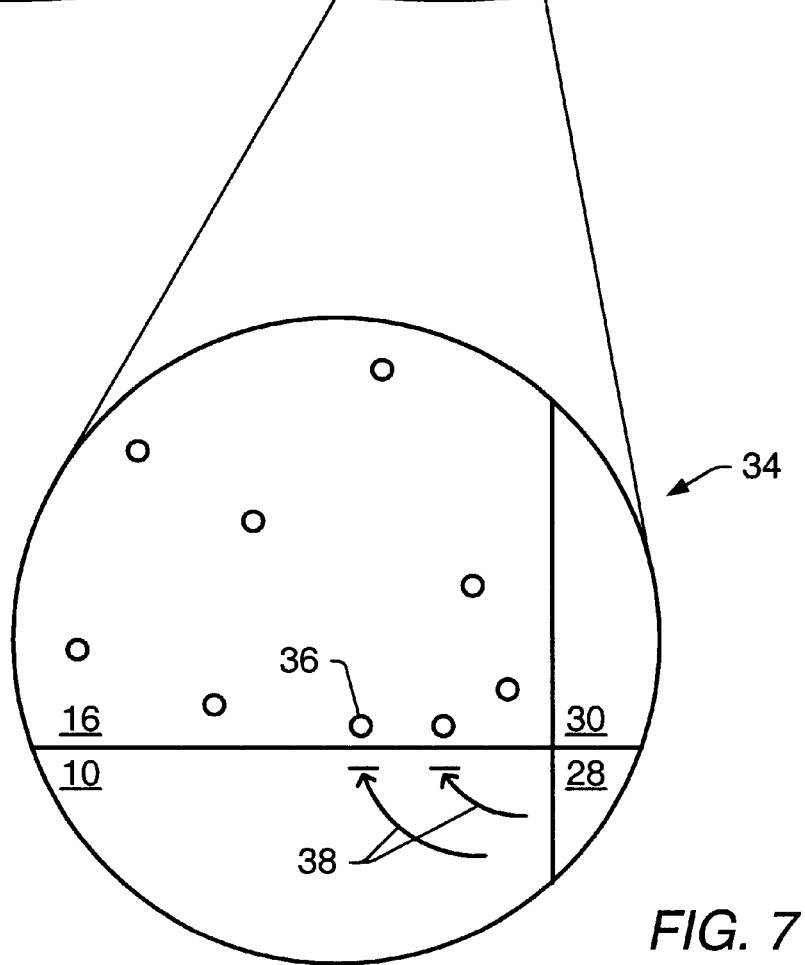
FIG. 7 is a detailed view of section 34 of FIG. 6, wherein an atomic view is presented illustrative of barrier atoms blocking the migration of charged carriers into the gate oxide during operation of the transistor formed according to the exemplary steps of FIGS. 1–6.

FIG. 7 illustrates a detailed view of section 34 of FIG. 6. The presence of nitrogen atoms 36 throughout gate oxide 16 helps to abate HCI even further. Because nitrogen atoms are bonded to silicon and oxygen atoms at uniform intervals within gate oxide 16, the nitrogen atoms occupy diffusion avenues that would normally exist at the gate oxide/substrate interface. Nitrogen atoms 36 block the migration pathways into gate oxide 16, thus minimizing if not preventing hot carrier injection into gate oxide 16, as shown by reference numeral 38. Moreover, since nitrogen atoms and silicon atoms form strong Si—N bonds, these bonds are not easily broken by hot electrons that are able to pass through the diffusion/migration avenues. It is postulated that only few hot electrons have sufficient kinetic energy to break strong Si—N bonds located near the interface between the substrate and the gate oxide. Thus, the number of hot electrons becoming trapped at broken bond sites within the dielectric are reduced.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A transistor, comprising:

a gate oxide interposed between a silicon substrate and a polysilicon gate conductor, said gate conductor and said gate oxide having a pair of opposed, first and second sidewall surfaces, wherein the sidewall surfaces of said gate oxide and said gate conductor are substantially aligned, and wherein said gate oxide comprises a plurality of barrier atoms;

a first implant region arranged within said silicon substrate and aligned on one side with said first sidewall surface;

a second implant region arranged within said silicon substrate and aligned on one side with said second sidewall surface; and a third implant region arranged within said silicon substrate and extending within the second implant region and aligned on one side a spaced lateral distance from said second sidewall surface;

wherein said second implant region comprises a lightly doped drain (LDD) species arranged at a concentration level less than species arranged within the first and third implant regions.

2. The transistor as recited in claim 1, wherein said second implant region extends to an elevation level within the silicon substrate less than an elevational level at which the first and third implant regions extend.

3. The transistor as recited in claim 1, wherein said first implant regions comprises a source-side junction area.

4. The transistor as recited in claim 1, wherein said third implant region comprises a drain within a drain-side junction area.

5. The transistor as recited in claim 1, wherein said plurality of barrier atoms comprises nitrogen atoms.

6. The transistor as recited in claim 1, wherein said first, second and third implant regions comprise a plurality of n-type dopants.

7. The transistor as recited in claim 1, wherein said first, second and third implant regions comprises a plurality of p-type dopants.

8. The transistor as recited in claim 1, further comprising first and second oxide spacers arranged upon respective said first and second sidewall surfaces, wherein said second oxide spacer extends exclusively over said second implant region.

* * * * *